(12) United States Patent
Wang et al.

(10) Patent No.: US 10,699,034 B2
(45) Date of Patent: Jun. 30, 2020

(54) FLOW TRANSITION TECHNOLOGY

(71) Applicant: Dassault Systems Simulia Corp., Johnston, RI (US)

(72) Inventors: Hongwu Wang, Sharon, MA (US); Matias Zielonka, Houston, TX (US); Lin Xia, Cumberland, RI (US)

(73) Assignee: DASSAULT SYSTEMES SIMULIA CORP., Providence, RI (US)

( * ) Notice: Subject to any disclaimer, the term of this patent is extended or adjusted under 35 U.S.C. 154(b) by 795 days.

(21) Appl. No.: 14/985,648

(22) Filed: Dec. 31, 2015

(65) Prior Publication Data

US 2016/0186532 A1 Jun. 30, 2016

Related U.S. Application Data

(60) Provisional application No. 62/098,608, filed on Dec. 31, 2014.

(51) Int. Cl.
*G06F 30/00* (2020.01)

(52) U.S. Cl.
CPC .................. *G06F 30/00* (2020.01)

(58) Field of Classification Search
CPC .......... G06F 17/50; G06F 30/00; G06F 30/20; G06F 30/23
See application file for complete search history.

(56) References Cited

U.S. PATENT DOCUMENTS

2013/0090902 A1* 4/2013 Yao .................. E21B 43/26
                                                       703/2
2016/0341850 A1* 11/2016 Lin ..................... E21B 41/0092

OTHER PUBLICATIONS

Kresse, O., et al. "Numerical modeling of hydraulic fracturing in naturally fractured formations." 45th US Rock Mechanics/Geomechanics Symposium. American Rock Mechanics Association, 2011. (Year: 2011).*
Chen, Zuorong. "Finite element modelling of viscosity-dominated hydraulic fractures." Journal of Petroleum Science and Engineering 88 (2012): 136-144. (Year: 2012).*
Furtney, J., F. Zhang, and Y. Han. "Review of methods and applications for incorporating fluid flow in the discrete element method." Proceedings of the 3rd International FLAC/DEM Symposium, Hangzhou, China. 2013. (Year: 2013).*
Komoróczi, Andrea, Steffen Abe, and Janos L. Urai. "Meshless numerical modeling of brittle-viscous deformation: first results on boudinage and hydrofracturing using a coupling of discrete element method (DEM) and smoothed particle hydrodynamics (SPH)." Computational Geosciences 17.2 (2013): 373-390. (Year: 2013).*
Kresse, Olga, and Xiaowei Weng. "Hydraulic fracturing in formations with permeable natural fractures." ISRM International Conference for Effective and Sustainable Hydraulic Fracturing. International Society for Rock Mechanics and Rock Engineering, 2013. (Year: 2013).*

(Continued)

*Primary Examiner* — Omar F Fernandez Rivas
*Assistant Examiner* — Joshua E. Jensen
(74) *Attorney, Agent, or Firm* — Armstrong Teasdale LLP

(57) ABSTRACT

Embodiments provide methods and systems for modeling the flow of fluid in variable physical and geological environments using dynamically determined Navier-Stokes equations (NSE), such as Darcy Flow and Poiseuille flow.

17 Claims, 11 Drawing Sheets
(4 of 11 Drawing Sheet(s) Filed in Color)

(56) References Cited

OTHER PUBLICATIONS

Crittendon, B.C., "The mechanics of design and interpretation of hydraulic fracture treatments", Journal of Petroleum Technology, pp. 21-29, 1959.

Hubbert, M.K. and Wills, D.G., "Mechanics of hydraulic fracturing", Journal of Petroleum Technology, vol. 9, No. 6, pp. 153-168, 1957.

Barenblatt, G.I., "The mathematical theory of equilibrium crack in brittle fracture", Advances in Applied Mechanics, vol. 7, pp. 5-129, 1962.

Perkins, T.K. and Kern, L.R., "Widths of hydraulic fractures", Journal of Petroleum Technology, vol. 13, No. 9, pp. 937-949, 1961.

Geertsma, J. and de Klerk, F., "A rapid method of predicting width and extent of hydraulically induced fractures", Journal of Petroleum Technology, vol. 21, No. 12, pp. 1571-1581, 1969.

Detournay, E. and Garagash, D., "The tip region of a fluid-driven fracture in a permeable elastic solid", Journal of Fluid Mechanics, vol. 494, pp. 1-32, 2003.

Valko, P., Economides, M.J., "Hydraulic Fracture Mechanics", John Wiley & Sons, 2001.

Adachi, J., Siebrits, E., Peirce, and A., Desroches, J., "Computer simulation of hydraulic fractures", International Journal of Rock Mechanics & Mining Sciences, vol. 44, pp. 739-757, 2007.

Boone, T.J., and Ingraffea, R., "A numerical procedure for simulation of hydraulically-driven fracture propagation in poroelastic media", International Journal for Numerical and Analytical Methods in Geomechanics, vol. 14, pp. 27-47, 1990.

Carter, B.J, Desroches, J., Ingraffea, A.R. and Wawrzynek, P.A., "Simulating fully 3d hydraulic fracturing", Modeling in Geomechanics, Ed. Zaman, Booker, and Gioda, Wiley Publishers, 730p, 2000.

Witherspoon, P.A., Tsang, Y.W., Iwai, W.K., and, Gale, J.E., "Validity of cubic law for fluid flow in a deformable rock fracture", Water Resources Research, vol. 16, No. 6, pp. 1016-1024, 1980.

Tsang, Y.W., and Witherspoon, P.A., "Hydromechanical behavior of a deformable rock fracture subject to normal stress", Journal of Geophysical Research, vol. 86, pp. 9287-9298, 1981.

Lam, K.Y., and Cleary, M. P., "Three-dimensional fracture propagation under specified well-bore pressure", Int. J. Numer. Anal. Meth. Geomech, vol. 12, pp. 583-598, 1988.

Sesetty,. V., and Ghassemi, A., "Modeling and analysis of stimulation for fracture network generation", Proceedings, Thirty-Seventh Workshop on Geothermal Reservoir Engineering, Stanford University, Stanford, California, Jan. 30-Feb. 1, 2012.

Chen, Z., Bunger, A.P., Zhang, X., and Jeffrey, R.G., "Cohesive zone finite element-based modeling of hydraulic fractures", Acta Mechanica Solida Sinica, vol. 22, No. 5, 2009.

Carrier, B., and Granet, S., "Numerical modeling of hydraulic fracture problem in permeable medium using cohesive zone model", Engineering Fracture Mechanics, vol. 79, 312-328, 2012.

Gordeliy, E., and Peirce, A., "Coupling schemes for modeling hydraulic fracture propagation using the XFEM", Comput. Methods Appl. Mech. Engrg., vol. 253, pp. 305-322, 2013.

Gordeliy, E., and Peirce, A., "Implicit level set schemes for modeling hydraulic fracture using the XFEM", Comput. Methods Appl. Mech. Engrg., vol. 266, pp. 125-143, 2013.

Zhang, X., Jeffrey, R.G., and Thiercelin, M., "Mechanics of fluid-driven fracture growth in naturally fractured reservoirs with simple network geometries", Journal of Geophysical Research, vol. 114, 2009.

Mohammadnejad, T., and Khoei, A. R., "Hydro-mechanical modeling of cohesive crack propagation in multiphase porous media using the extended finite element method", Int. J. Numer. Anal. Meth. Geomech, vol. 37, pp. 1247-1279, 2013.

Mohammadnejad, T., and Khoei, A. R., "An extended finite element method for hydraulic fracture propagation in deformable porous media with the cohesive crack model", Finite Elements in Analysis and Design, vol. 73, pp. 77-95, 2013.

Abaqus, "Flow Transition Technology: Two-Dimensional Cohesive Element Library" (code was made public Nov. 13, 2015). Associated documentation release in Abaqus 2016 Beta: Jul. 15, 2015.

Abaqus, "Flow Transition Technology: Three-Dimensional Cohesive Element Library" (code was made public Nov. 13, 2015). Associated documentation release in Abaqus 2016 Beta: Jul. 15, 2015.

Abaqus, "Flow Transition Technology: Axisymmetric Cohesive Element Library" (code was made public Nov. 13, 2015). Associated documentation release in Abaqus 2016 Beta: Jul. 15, 2015.

Abaqus, "Flow Transition Technology: Choosing a Cohesive Element" (code was made public Nov. 13, 2015). Associated documentation release in Abaqus 2016 Beta: Jul. 15, 2015.

Abaqus, "Flow Transition Technology: Defining the Constitutive Response of Fluid Transitioning from Darcy Flow to Poiseuille Flow" (code was made public Nov. 13, 2015). Associated documentation release in Abaqus 2016 Beta: Jul. 15, 2015.

Abaqus, "Flow Transition Technology: Abaqus/Standard Element Index" (code was made public Nov. 13, 2015). Associated documentation release in Abaqus Beta: Jul. 15, 2015. 2016.

* cited by examiner

Four types of interaction between hydraulic cracks and pre-existing fractures (after Thiereelin et. al. 1987).

The role of friction and secondary flaws on deflection and re-initiation of hydraulic fractures at orthogonal pre-existing fractures
Geophysics Journal International
Xi Zhang and Robert G. Jeffrey

FLOW TRANSITION TECHNOLOGY

RELATED APPLICATIONS

This application claims the benefit of U.S. Provisional Application No. 62/098,608, filed on Dec. 31, 2015. The entire teachings of the above application(s) are incorporated herein by reference.

COMMON OWNERSHIP UNDER JOINT RESEARCH AGREEMENT 35 U.S.C. 102(c)

The subject matter disclosed in this application was developed, and the claimed invention was made by, or on behalf of, one or more parties to a Joint Development Agreement that was in effect on or before the effective filing date of the claimed invention. The parties to the Joint Research Agreement are as follows Dassault Systemes Simulia Corp. and ExxonMobil Upstream Research Company.

BACKGROUND OF THE INVENTION

The invention generally relates to the field of computer programs and systems, and to the field of computer aided design (CAD), computer-aided engineering (CAE), modeling, and simulation. Specifically, the invention described herein relates to modeling/simulating the flow of fluids.

A specific use of embodiments of the invention is in the numerical simulation of hydraulic fracture. While it is not the only potential application for the invention, the review of background art presented herein will focus on hydraulic fracture—with emphasis on the modeling of fluid flow inside of fractures.

Hydraulic fracturing (commonly referred to as fracking) is the process of initiation and propagation of an underground crack by pumping fluid at relatively high flow rates and pressures. Hydraulic fracturing is desired for a variety of reasons, including enhanced oil and gas recovery deep below the earth. Field data from hydraulic fracturing operations exists primarily in the form of pressure response curves. It is difficult to define the actual hydraulic fracture geometry from this data alone. Therefore, analytical solutions and numerical simulations are used to evaluate and predict the location, direction, and extent of these hydraulic fractures.

The first simplified theoretical models for hydraulic fracturing were developed by Crittendon (1959) and Hubbert and Wills (1957). The methods of fracture mechanics were first applied to this problem by Barenblatt (1962). Pioneering works include papers by Perkins and Kern (1961) who adapted the classic elasticity plane strain crack solution to establish the so-called PK model and Geertsma and de Klerk (1969) who developed the KGD model. A significant amount of research has been carried out to obtain analytical solutions for different cases Detournay and Garagash (2003). Many of these early works are summarized in Valko and Economides (2001) and Adachi, et al. (2007).

However, because the analytical model and the empirical approaches cannot handle fractures of arbitrary shape and orientations, a fully 3D hydraulic fracture numerical simulator is vital to the petroleum industry. Boone and Ingraffea (1990) took a first step towards a fully coupled numerical solution general purpose hydraulic fracture code. This work was followed up with a commercial software product for modeling hydraulic fracture as discussed in Carter (2000).

Most references on numerical simulations of hydraulic fracture in the technical literature assume a form of Poiseuille flow between parallel plates or a cubic law (which is closely related to Poiseuille flow) for fluid equilibrium within an open fracture—either a natural fracture or a propagating fracture. Herein tangential flow within a fracture will be referred to as gap flow.

The validity of cubic fluid flow laws within geo-mechanics fractures was studied in depth in Witherspoon, et. al. (1980) and Tsang and Witherspoon (1981) and their results are widely referenced in the numerical hydraulic fracture literature. In a cubic flow law, the volumetric flow rate is proportional to the cube of the effective fracture aperture.

While studying various topics in numerical simulations of hydraulic fracture Lam and Cleary (1988), Sesetty and Ghassemi (2012), Chen, et al. (2009), Carrier and Granet (2012) all used simple cubic flow solutions for modeling gap flow in cohesive zone models. In this context simple means that the effective aperture was the mechanical fracture aperture.

Gordeliy and Peirce (2013) and Gordeliy and Peirce (2013) investigated the use of the eXtended Finite Element Method (XFEM) coupled with hydrodynamic equations for gap flow to investigate problems in hydraulic fracture. They also used a simple cubic flow solution for modeling gap flow.

In Zhang, et al. (2009) the authors investigated fluid driven fracture within networks of natural fractures. To model the gap flow they followed the approach of Tsang and Witherspoon (1981) and others and used a cubic flow equation in which the flow is proportional to the cube of the effective hydraulic aperture. In their work they postulated and solved an evolution law for the effective hydraulic aperture.

Similarly while applying the eXtended Finite Element Method (XFEM) to hydraulic fracture Mohammadnejad and Khoei (2013) and Mohammadnejad and Khoei (2013) also used cubic flow laws with solution varying permeability.

Provided herein below is a listing of referenced literature, the contents of which are herein incorporated by reference.

Crittendon, B. C., "The mechanics of design and interpretation of hydraulic fracture treatments", Journal of Petroleum Technology, pp. 21-29, 1959.

Hubbert, M. K. and Wills, D. G., "Mechanics of hydraulic fracturing", Journal of Petroleum Technology, vol. 9, no. 6, pp. 153-168, 1957.

Barenblatt, G. I., "The mathematical theory of equilibrium crack in brittle fracture", Advances in Applied Mechanics, vol. 7, pp. 5-129, 1962.

Perkins, T. K. and Kern, L. R., "Widths of hydraulic fractures", Journal of Petroleum Technology, vol. 13, no. 9, pp. 937-49, 1961.

Geertsma, J. and de Klerk, F., "A rapid method of predicting width and extent of hydraulically induced fractures", Journal of Petroleum Technology, vol. 21, no. 12, pp. 1571-1581, 1969.

Detournay, E. and Garagash, D., "The tip region of a fluid-driven fracture in a permeable elastic solid", Journal of Fluid Mechanics, vol. 494, pp. 1-32, 2003.

Valko, P., Economides, M. J., "Hydraulic Fracture Mechanics", John Wiley & Sons, 2001.

Adachi, J., Siebrits, E., Peirce, and A., Desroches, J., "Computer simulation of hydraulic fractures", International Journal of Rock Mechanics & Mining Sciences, Vol. 44, pp. 739-757, 2007.

Boone, T. J., and Ingraffea, R., "A numerical procedure for simulation of hydraulically-driven fracture propagation in poroelastic media", International Journal for Numerical and Analytical Methods in Geomechanics, Vol. 14, pp. 27-47, 1990.

Carter, B. J, Desroches, J., Ingraffea, A. R. and Wawrzynek, P. A., "Simulating fully 3d hydraulic fracturing", Modeling in Geomechanics, Ed. Zaman, Booker, and Gioda, Wiley Publishers, 730 p, 2000.

Witherspoon, P. A., Tsang, Y. W., Iwai, W. K., and, Gale, J. E., "Validity of cubic law for fluid flow in a deformable rock fracture", Water Resources Research, vol. 16, no. 6, pp. 1016-1024, 1980.

Tsang, Y. W., and Witherspoon, P. A., "Hydromechanical behavior of a deformable rock fracture subject to normal stress", Journal of Geophysical Research, vol. 86, pp. 9287-9298, 1981.

Lam, K. Y., and Cleary, M. P., "Three-dimensional fracture propagation under specified well-bore pressure", Int. J. Numer. Anal. Meth. Geomech, Vol. 12, pp. 583-598, 1988.

Sesetty, V., and Ghassemi, A., "Modeling and analysis of stimulation for fracture network generation", Proceedings, Thirty-Seventh Workshop on Geothermal Reservoir Engineering, Stanford University, Stanford, Calif., Jan. 30-Feb. 1, 2012.

Chen, Z., Bunger, A. P., Zhang, X., and Jeffrey, R. G., "Cohesive zone finite element-based modeling of hydraulic fractures", Acta Mechanica Solida Sinica, vol. 22, no. 5, 2009.

Carrier, B., and Granet, S., "Numerical modeling of hydraulic fracture problem in permeable medium using cohesive zone model", Engineering Fracture Mechanics, vol. 79, 312-328, 2012.

Gordeliy, E., and Peirce, A., "Coupling schemes for modeling hydraulic fracture propagation using the XFEM", Comput. Methods Appl. Mech. Engrg., vol. 253, pp. 305-322, 2013.

Gordeliy, E., and Peirce, A., "Implicit level set schemes for modeling hydraulic fracture using the XFEM", Comput. Methods Appl. Mech. Engrg., vol. 266, pp. 125-143, 2013.

Zhang, X., Jeffrey, R. G., and Thiercelin, M., "Mechanics of fluid-driven fracture growth in naturally fractured reservoirs with simple network geometries", Journal of Geophysical Research, Vol. 114, 2009.

Mohammadnejad, T., and Khoei, A. R., "Hydro-mechanical modeling of cohesive crack propagation in multiphase porous media using the extended finite element method", Int. J. Numer. Anal. Meth. Geomech, Vol. 37, pp. 1247-1279, 2013.

Mohammadnej ad, T., and Khoei, A. R., "An extended finite element method for hydraulic fracture propagation in deformable porous media with the cohesive crack model", Finite Elements in Analysis and Design, vol. 73, pp. 77-95, 2013.

In their most general form, the Navier-Stokes equations (NSE) are a set of general three-dimension partial differential equations governing the motion of viscous fluids. A general form of these equations is:

$$\rho \frac{Dv}{Dt} = -\nabla p + \mu \nabla^2 v + f$$

Where $\rho$ is the fluid density, v is the fluid velocity, Dv/Dt is the material derivative, $\nabla p$ is the pressure gradient, $\mu$ is the dynamic viscosity, and f is a body force.

In their general form, the NSE are complex, computationally expensive to solve, and typically require sophisticated software tools to generate accurate solutions. However, in common engineering applications simplified versions of NSE, such as Darcy flow, Poiseuille flow, and Stokes flow, which are easier and quicker to solve, are often used as approximations to the full NSE.

The prior approaches described hereinabove use a single type of cubic flow within the fractures. What varied during the simulations was the effective aperture. These existing simulation techniques thus rely upon one version of the simplified NSE, which is not ideal for simulating the flow of fluid in a variable environment. Thus, existing techniques can benefit from methods and systems to model the flow of fluid using more accurate and more computationally efficient methods.

SUMMARY OF THE INVENTION

The invention described herein is an algorithmic approach to model the flow of fluids through regions characterized by different types of flow as a function of time. The uniqueness of this invention and the value it brings is the concept of automatically switching back and forth between different types of NSE as needed during a numerical simulation in order to improve performance as compared to a full NSE solution while at the same time maintaining acceptable engineering accuracy.

According to at least one example embodiment, a method of modeling the flow of fluid in a variable environment comprises defining a model of a variable geological or physical environment. In such an embodiment, the model includes one or more layers of cohesive coupled pressure elements. The method, according to such an embodiment further identifies, for each layer of the model, one or more fluid analysis techniques to model a flow of fluid in the respective layer. In such an embodiment, different layers may use different fluid analysis techniques to model respective flow of fluid. The method concludes by performing a simulation of the flow of fluid in the variable environment using the fluid analysis techniques identified for each layer.

In an example embodiment, the fluid analysis techniques are Navier-Stokes equations. In yet another embodiment, the fluid analysis techniques are at least one of Darcy flow and Poiseuille flow.

According to yet another embodiment, for a given layer, different fluid analysis techniques are used as a function of time to model a flow of fluid in the layer. In such an embodiment, the one or more fluid analysis techniques to model a flow of fluid in the given layer comprise Darcy flow and Poiseuille flow. The Darcy Flow models the flow of fluid in the layer over a first period of time and the Poiseuille flow models the flow of fluid in the layer over a second period of time.

As described herein, embodiments of the present invention model the flow of fluid in variable geological and physical environments. Thus, embodiments described herein may model hydraulic fracturing and injection molding, amongst others. Moreover, in the methods and systems described herein, the fluid may comprise water and proppant.

An alternative embodiment is directed to a system for modeling the flow of fluid in a variable environment. Such a system includes a model definition module configured to define a model of a variable geological or physical environment, the model including one or more layers of cohesive coupled pressure elements. Further, an analysis module is operatively coupled to the model definition module and configured to, for each layer of the model, identify one or more fluid analysis techniques to model a flow of fluid in the respective layer, different layers using different fluid analysis techniques to model respective flow of fluid. Further still, the system includes a simulation module configured to perform a simulation of the flow of fluid in the variable environment using the fluid analysis techniques identified for each layer. The various embodiments of the systems described herein may be configured to perform any embodiment of the invention described herein.

Yet another embodiment of the present invention is directed to a cloud computing implementation for modeling the flow of fluid in a variable environment. Such an embodiment is directed to a computer program product executed by a server in communication across a network with one or more clients, the computer program product comprises a computer readable medium, the computer readable medium comprises program instructions which, when executed by a processor causes: defining a model of a variable geological or physical environment, the model including one or more layers of cohesive coupled pressure elements; for each layer of the model, identifying one or more fluid analysis techniques to model a flow of fluid in the respective layer, different layers using different fluid analysis techniques to model respective flow of fluid; and performing a simulation of the flow of fluid in the variable environment using the fluid analysis techniques identified for each layer.

BRIEF DESCRIPTION OF THE DRAWINGS

The patent or application file contains at least one drawing executed in color. Copies of this patent or patent application publication with color drawings will be provided by the Office upon request and payment of the necessary fee.

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

DETAILED DESCRIPTION OF THE INVENTION

A description of example embodiments of the invention follows.

The teachings of all patents, published applications, and references cited herein are incorporated by reference in their entirety.

The targeted use-cases for this invention are engineering scenarios where the appropriate and most efficient version in a given region of the NSE changes over time. In order to give some context two representative applications are described herein below.

One field of application for this invention is numerical simulation of hydraulic fracturing, i.e. fracking. Fracking is the process of inducing fracture in rock using fluids pumped in at high pressure. There are a number of common workflows used by the oil and gas industry which rely on fracking. In these workflows, the fracturing of the rock is achieved by pumping fracturing fluid into the target formation (area from which materials are being extracted) with pressure high enough to overcome both the confining hydrostatic pressure of the overlying geologic structures as well as the tensile strength of the rock. Such an example is illustrated in FIG. 1.

Figure 1:
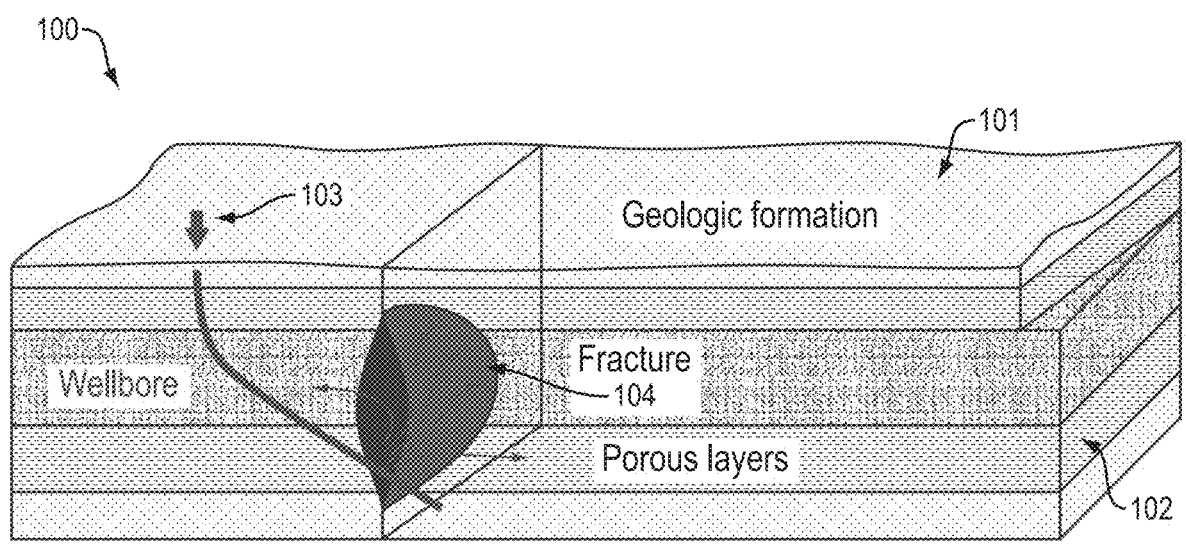
FIG. 1 is a simplified illustration of fracking.

FIG. 1 illustrates the target formation 100, from which materials, such as oil and gas are being extracted. The target formation 100 includes a geologic formation layer 101 and porous layers 102. Material extraction from the porous layers 102 can be improved by fracking. One such technique utilizes a wellbore 103, which provides access to the porous layers 102. Fluid is pumped into the porous layers 102 via the wellbore 103 to induce the fracture(s) 104.

In a numerical simulation of hydraulic fracturing the fluid flow in the porous layers 102 is typically modeled as Darcy flow. Inside an open area, such as a fracture 104, the flow is modeled using another form of the Navier-Stokes equations, such as Poiseuille flow. As the fracture propagates through undamaged regions of the formation, a transition of the flow equations from Darcy flow to Navier-Stokes is required. If the pressure inside the fracture 104 is reduced it may re-close and the flow reverts from Navier-Stokes flow back to Darcy flow. This cycle of opening and closing can happen many times during a typical simulation. Existing techniques do not properly account for these variable conditions and thus do not provide the most efficient and/or accurate simulation.

Four common drilling workflows used by the oil and gas industry which rely on hydraulic fracturing are: water injection, drill cutting injections, drilling wellbore integrity, and lost returns and fracture stimulation.

To give a frame-of-reference, a brief description of fracture stimulation is provided here. The goal of fracture stimulation is to increase the production of hydrocarbons from a reservoir (target formation), e.g., 100. The fracking process accomplishes this by increasing the permeability of the reservoir by hydraulically fracturing the rock. The fracturing fluid is also used to carry proppant into the fractures. The role of the proppant is to keep the fractures open and thus, keep the effective permeability high. The fluid is pumped into an otherwise closed well (no recirculation). Pressure is applied to the formation selectively to cause fracture at the desired location. This technique is often used in shale which contains a network of natural fractures. These fractures are "open" and filled with either natural gas (the target material) or water.

Figure 2:
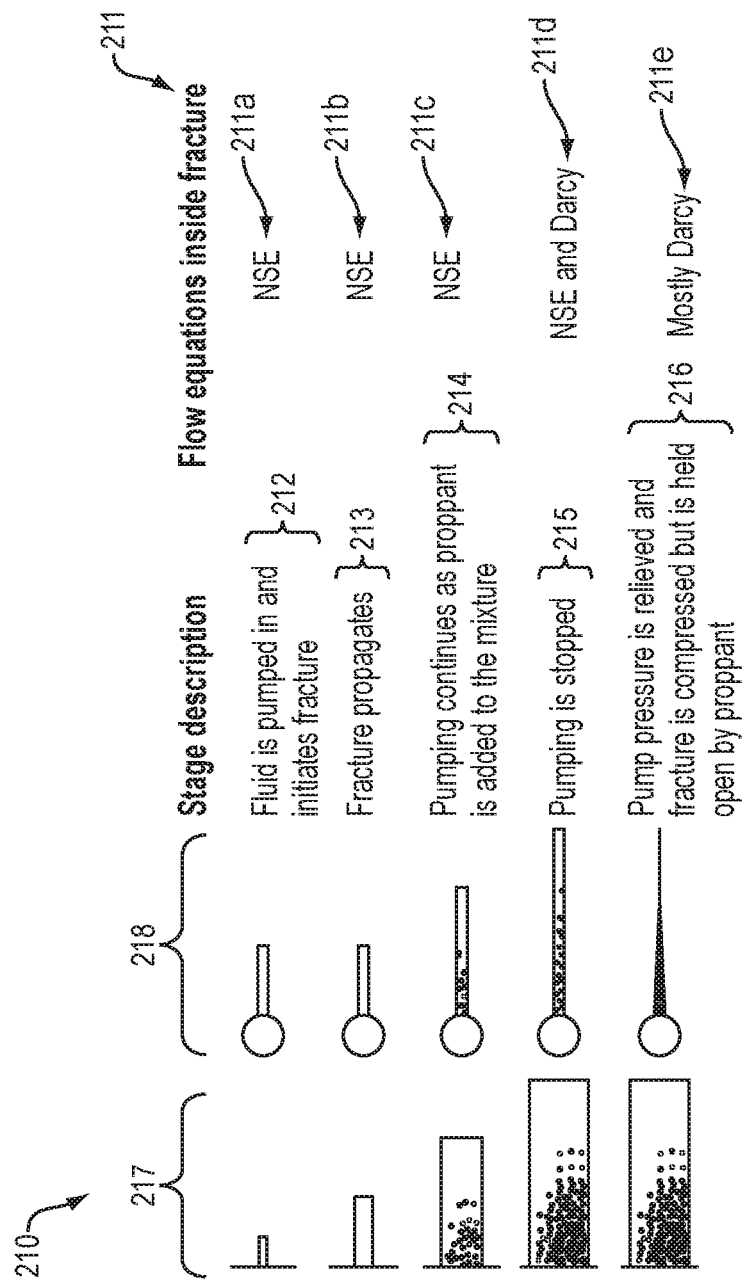
FIG. 2 illustrates fractures and describes the various stages and simulation techniques used at each stage.

FIG. 2 illustrates and describes a method 210 of a fracture stimulation process. It also includes the dominant flow equations 211 needed to simulate the fracture at the various stages of fracture stimulation. FIG. 2 further illustrates 217 and the fracture 218 at the various stages of fracking. The process begins when fluid is pumped in and initiates the fracture (212). In response, the fracture propagates (213). Pumping then continues and proppant is added to the mixture (214). The stages 212, 213, and 214 of the fracking process 210, are modeled by NSE 211a-c. Next, pumping is stopped 215, which is simulated using NSE and Darcy flow 211d. Finally, the process 210 concludes and pump pressure is relieved and the fracture compresses, but is held open by the proppant (216). This final stage 216 is modeled generally using the Darcy flow method 211e.

Figure 3:
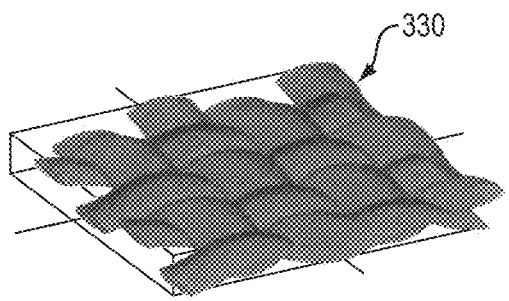
FIG. 3 illustrates a material that may be employed in a resin molding simulation carried out in accordance with an embodiment.

Another field of application of the simulation methods/systems described herein is the numerical simulation of the resin injection process for fiber and braided composites. Liquid composite molding (LCM) is one example of this. LCM is a multistep manufacturing process for creating composite parts. The basic steps include: (1) placing a dry fabric part into a mold which has the desired shape of the final component (sometimes referred to as a preform); (2) injecting liquid (resin) into the mold; (3) allowing the resin to cure, and; (4) removing the part. FIG. 3 illustrates a typical dry braided geometry 330 which may be utilized in a resin injection process.

During a numerical simulation of the injection process the flow of the resin through the preform, i.e. mold, may need to transition between Darcy flow and another version of Navier-Stokes depending on the spacing of the fabric fibers in order to accurately model the resin flow.

As mentioned above, embodiments of the invention provide an algorithmic approach to model the flow of fluids through regions characterized by different types of flow as a function of time. The uniqueness of this invention and the value it brings is the concept of automatically switching back and forth between these types of flow as needed during a numerical simulation. Embodiments switch from one flow solution to another through use of special transition equations.

One form of the transition flow equations, can be represented as:

$$Q = f_{NSE_1}(S_{transition}) * Q_{NSE_1} + f_{NSE_2}(S_{transition}) * Q_{NSE_2}$$

Where Q is the volumetric flow rate of a fluid, $f_{NSE_1}$ is a scaling factor for one form of the NSE which depends on state variables $S_{transition}$ which controls the transition from one form of the NSE to another, $f_{NSE_2}$ is a similar scaling factor for another form of NSE flow, and $Q_{NSE_1}$ and $Q_{NSE_2}$ are respective volumetric flow rates governed by the two different forms of the NSE.

To properly model flow continuity the scaling factors satisfy the constraint $$f_{NSE_1}(S_{transition}) + f_{NSE_2}(S_{transition}) = 1$$

As an example of the volumetric flow rates for a form of NSE, consider the case of Darcy flow. Darcy flow defines a relationship between the volumetric flow rate of a fluid $Q_{Darcy}$ and the fluid pressure gradient in a porous material, such as the porous layer 102 of the target formation 100. The relationship can be described by the equation:

$$Q_{Darcy} = -k_t(\nabla p - \rho g)$$

Where $k_t$ is the effective matrix permeability, $\nabla p$ is the pressure gradient, and $\rho g$ is the gravity loading.

The advantage embodiments bring to numerical simulation is a methodical and comprehensive framework to systematically handle the transition between flow regimes in a numerical simulation of realistic physical systems. This approach allows the simulation tools to automatically choose the most efficient numerical flow solution for a given region while at the same time maintaining needed levels of accuracy.

Note that embodiments of this invention can be used in conjunction with other approaches for modeling flow in fractures as discussed herein. For example, the volumetric flow rates $Q_{NSE_1}$ and $Q_{NSE_2}$ discussed above can be modified during a simulation in a manner similar to that discussed in Zhang, et al. (2009). In essence the existing flow approaches discussed herein can be considered a subset of this invention.

Figure 4:
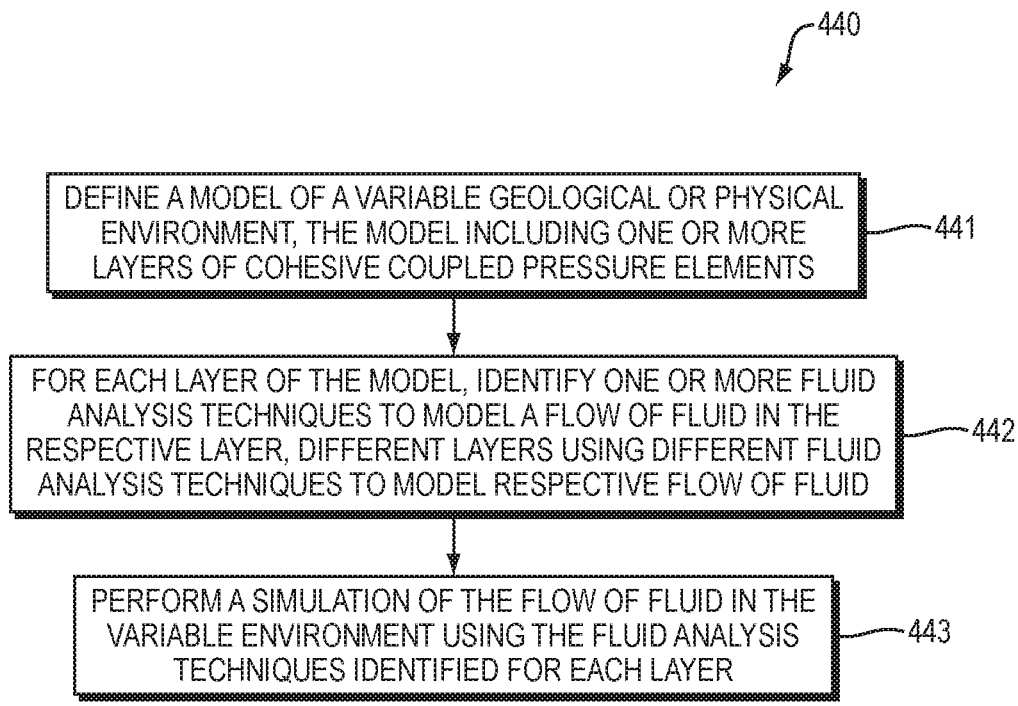
FIG. 4 is a flow diagram of a method of simulating fluid flow according to an embodiment.

FIG. 4 is a flow diagram of a method 440 for modeling the flow of fluid in a variable environment. The method 440 begins by defining a model of a variable geological or physical environment (441). This may be done using techniques known in the art. For example, through use of CAD/CAE tools. The model that is defined at step 441 includes one or more layers of cohesive coupled pressure elements. Further still, the defined model may be in any form known in the art, for example, the model may be a 3D CAD model or a finite element mesh, amongst, other examples. Next, for each layer of the model, one or more fluid analysis techniques are identified to model a flow of fluid in the respective layer (442). At step 442, it may be determined that different layers use different fluid analysis techniques to model the respective flow of the fluid. For example, one layer may be modeled by Darcy flow while another layer is modeled by Poiseuille flow. Moreover, it may be determined that multiple fluid analysis techniques are used to model the flow of fluid in a given layer. To continue, after identifying fluid analysis techniques for the layers of the model (442), the method 440 concludes by performing a simulation of the flow of fluid in the variable environment using the identified techniques (443). This simulation (443) may be performed using the transition equations described herein below.

The method 440 may be implemented using a computing device. In such an embodiment, the computing device, along with one or more processors executes software instructions that carry out the various steps of the method 440.

In an embodiment of the method 440, the fluid analysis techniques identified at step 442 may be Navier-Stokes equations. For example, such fluid analysis techniques may be Darcy flow and/or Poiseuille flow. According to yet another embodiment of the method 440, wherein for a given layer, different fluid analysis techniques are used, these techniques may be used as a function of time to model a flow of fluid in the layer. The one or more fluid analysis techniques used to model a flow of fluid in the given layer, in such an embodiment may comprise Darcy flow and Poiseuille flow. The Darcy flow models the flow of fluid in the layer over a first period of time and the Poiseuille flow models the flow of fluid in the layer over a second period of time.

As described herein, the method 440 models the flow of fluid in a variable environment. Example implementations of the method 440 include modeling hydraulic fracturing and injection molding. In embodiments described herein, the fluid being modeled may comprise a liquid such as water and solid materials such as proppant.

Figure 5A:
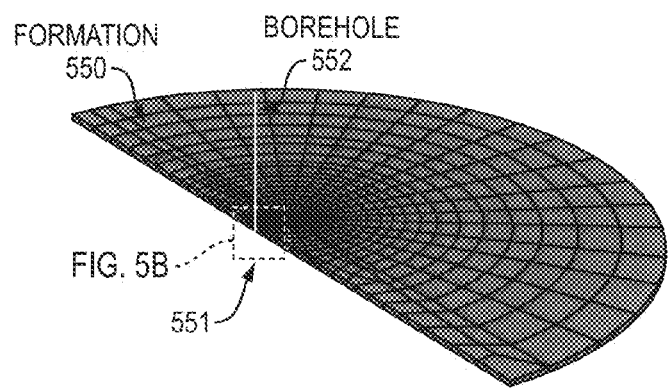
FIG. 5A-C illustrates fracking models that may be employed in embodiments of the present invention.
Figure 5B:
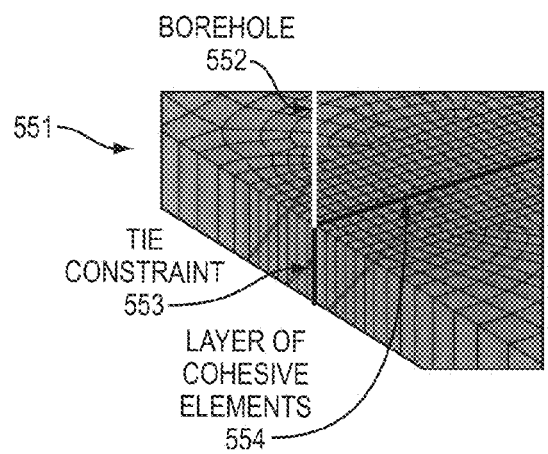
Figure 5C:
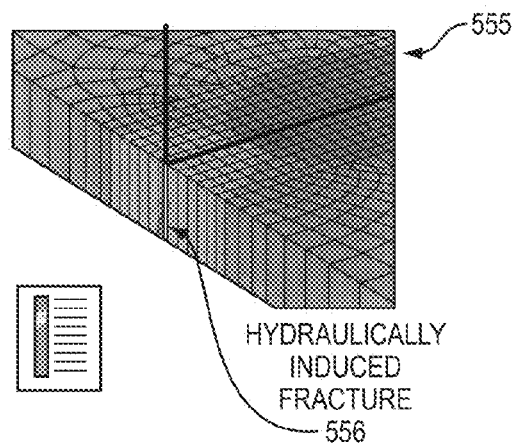

An embodiment of the invention may be implemented by leveraging and modifying existing components that are available in simulation tools. For example, the coupled pore pressure-displacement cohesive elements may be designed to model both existing natural fractures as well as propagating hydraulic fractures along pre-determined paths and planes. Examples of such are illustrated in FIGS. 5A-C. FIG. 5A illustrates the formation 550 including the borehole 552, through which fluid may be pumped to induce a fracture. The portion 551 the formation 550 illustrated in FIG. 5A is enlarged in FIGS. 5B-C to show further parameters of the formation 550 that may be utilized in modeling fracking of the formation 550. In FIG. 5B, the enlarged portion 551 illustrates the borehole 552 and tie constraint 553 along with layers of cohesive elements 554. Similarly, FIG. 5C illustrates the formation 555 with the hydraulically induced fracture 556.

Figure 6A:
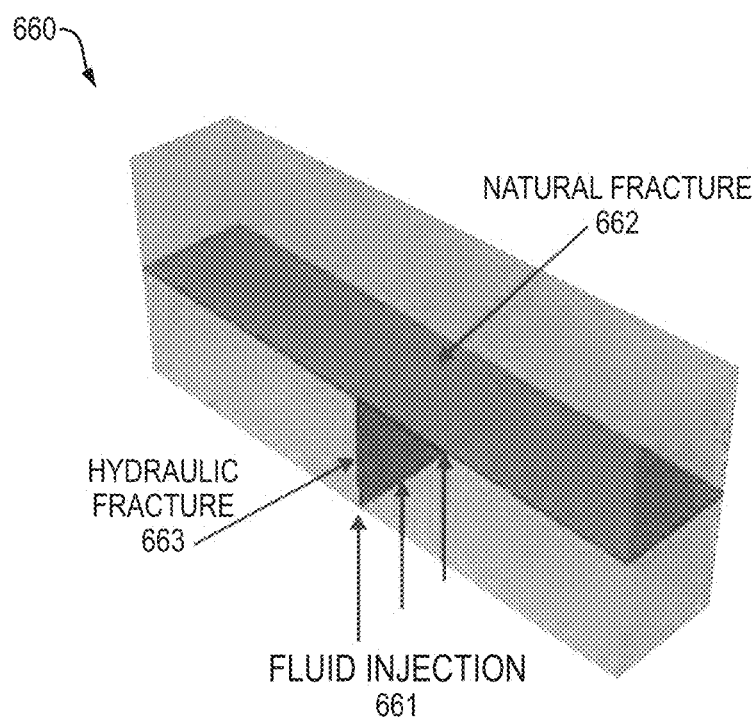
FIG. 6A is a simplified diagram illustrating the interaction between a natural fracture and a hydraulic fracture.
Figure 6B:
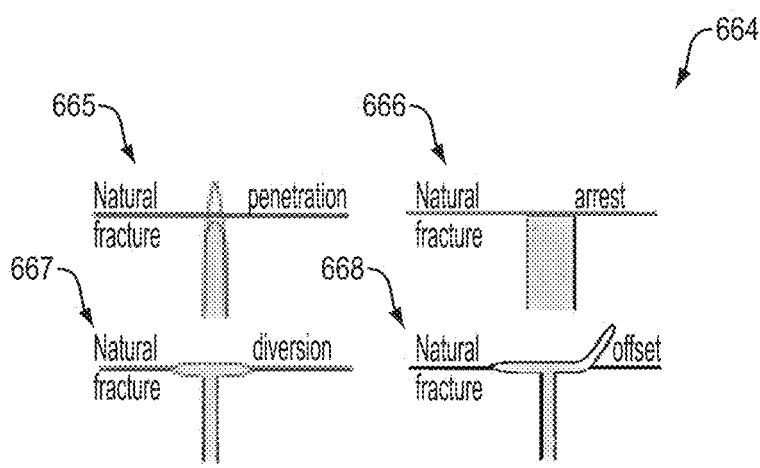
FIG. 6B illustrates a variety of interaction types between natural fractures and hydraulic fractures that may be simulated using principles of the present invention.

FIGS. 6A and 6B further illustrate the interaction of hydraulic fracture and natural fractures that may be simulated using principles described herein. FIG. 6A illustrates the fluid injection 661, which creates the hydraulic fracture 663 that is interconnected to the natural fracture 662. Similarly, FIG. 6B illustrates four types of interactions between hydraulic fractures and pre-existing fractures 664. Element 665 of FIG. 6B illustrates penetration, i.e. where the hydraulic fracture proceeds through the natural fracture. Oppositely, element 666 illustrates arrest 666. Moreover, element 667 illustrates a diversion interaction and element 668 illustrates an offset interaction.

The mechanical behaviors of the various elements described herein are governed by a traction-separation behavior which supports elastic response coupled with a complete set of damage behaviors including: damage initiation, damage evolution, and complete removal of the elastic response. According to an embodiment of the invention, the state of damage in a given element which is used to modify the elastic response of the element is tracked throughout the simulation and stored in a local damage variable D.

Figure 7:
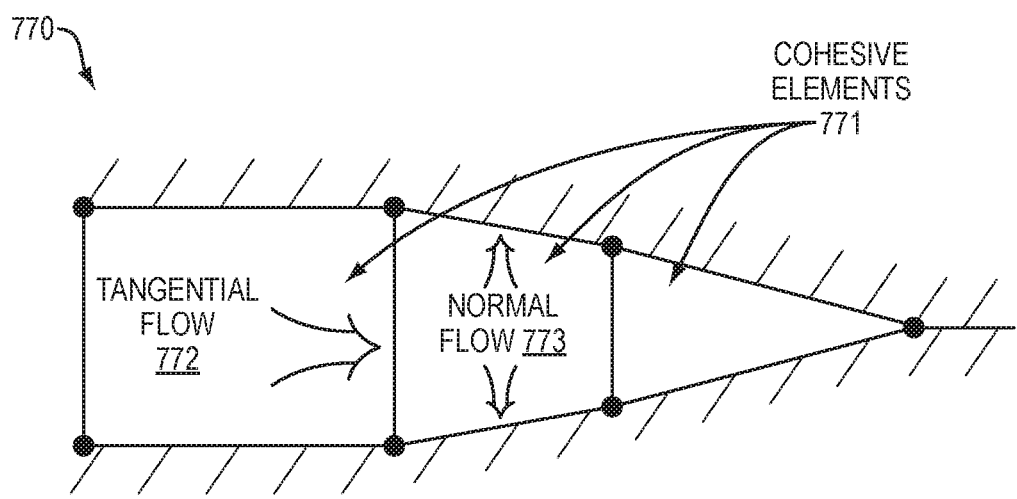
FIG. 7 illustrates the flow of fluid in cohesive elements that may be used in an embodiment.

Furthermore, in embodiments, the mechanical response may be fully coupled with fluid equilibrium and fluid continuity equations for tangential flow along the cohesive element mid-surface along with normal leakoff flow through the top and bottom surfaces. The flow patterns of the pore fluid in the element are illustrated in FIG. 7. FIG. 7 depicts the flow in a fracture 770, which is being modeled by the three cohesive elements 771, such as the elements 554 in FIG. 5. In this fracture 770, there is a tangential flow 772, i.e. along the direction of the fracture 770, and a normal flow 773, i.e., perpendicular to the fracture 770

Figure 8:
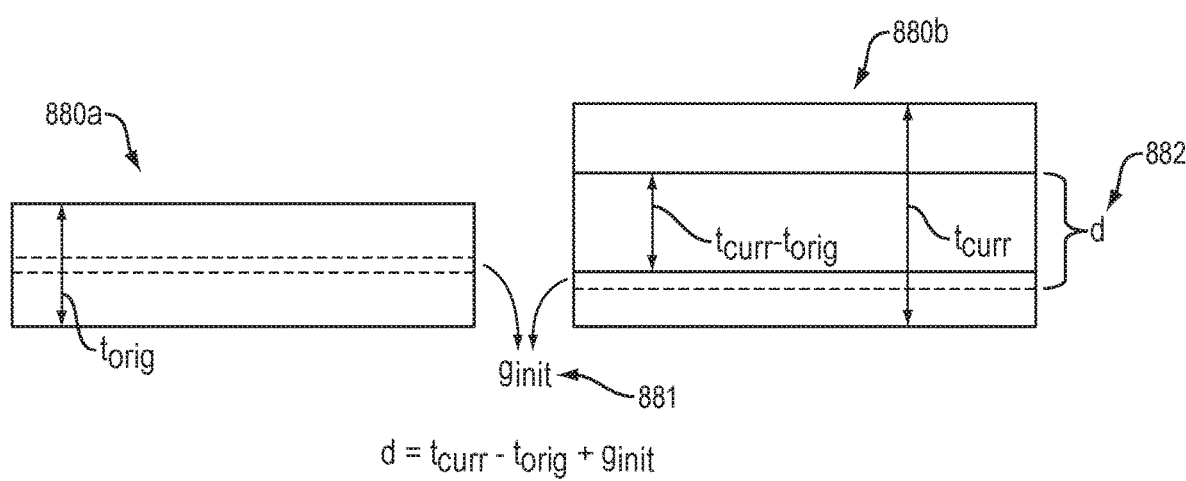
FIG. 8 schematically depicts an initial gap in an element representing a geological formation and the subsequent gap caused by hydraulic fracturing, which may be modelled by embodiments.

The coupled pore pressure-displacement cohesive elements support two flow approximations; Darcy flow and Poiseuille. Poiseuille is a special case of Navier-Stokes commonly used to model laminar flow between two parallel plates. In simulating the flow, according to an embodiment, the tangential flow equations for the cohesive element are solved within a gap along the length of the cohesive element. The gap opening, d, is defined as $d=t_{curr}-t_{orig}+g_{init}$ where $t_{curr}$ and $t_{orig}$ are the current and original cohesive element geometrical thicknesses, respectively; and $g_{init}$ is the initial gap opening, which has a default value of 0.002, in an embodiment. The variable $g_{init}$ is not a physical quantity. It is used by simulation software, which is employed to implement embodiments of the invention to ensure an initial gap that is large enough to avoid numerical difficulties when the crack initially opens. This is illustrated in FIG. 8, where 880a illustrates the original cohesive element with $g_{init}$ 881 through which fluid flow is being simulated. Cohesive element 880b illustrates the cohesive element 880a at some subsequent time, with gap d, 882, which has developed through the fracking simulation. The gap 882 is given by the above-mentioned equation.

In fracking simulations carried out according to the principles of the present invention, when the gap is closed, tangential flow in a cohesive element, such as 554 or 880b, will transition from Darcy flow to Poiseuille flow as damage in the element initiates and evolves. The transition is designed to approximate the changing nature of fluid flow through an initially undamaged porous material (Darcy flow) to flow in a crack (Poiseuille flow) as the material is damaged. If an opened cohesive element closes back up due to external loadings the flow in the gap transitions back to a Darcy flow to better model the physical system.

Darcy flow in the cohesive element defines a simple relationship between the volumetric flow rate of a fluid Q and the fluid pressure gradient in a porous material as:

$$Q=-k_{Darcy}(\nabla p-\rho g)$$

$k_{Darcy}$ is a proportionality constant which takes into account the matrix and fluid properties as well as the size of the gap opening d, $\nabla p$ is the pressure gradient along the cohesive element mid-surface, and $\rho g_t$ is the gravity loading.

Poiseuille flow in the cohesive element defines a similar relationship between the volumetric flow rate of a fluid Q and the fluid pressure gradient in a porous material as:

$$Q=-k_{Poiseuille}(\nabla p+\rho g)$$

$k_{Poiseuille}$ is a proportionality constant for Poiseuille flow which takes into account the matrix and fluid properties.

The cohesive element transition equations between Darcy and Poiseuille flow can be generally represented by the equation:

$$Q=-(f_{Darcy}(D,d)k_{Darcy}+f_{Poiseuille}(D,d)k_{Poiseuille})(\nabla P-\rho g_t)$$

The terms $f_{Darcy}$ and $f_{Poiseuille}$ are respectively the transition scaling factors for Darcy and Poiseuille Poiseuille which are functions of both the damage variable D and the gap opening d. Abaqus, for example, supports different implementations of $f_{Darcy}$ and $f_{Poiseuille}$, which can be chosen by the user. To properly model flow continuity the scaling factors satisfy the constraint $$f_{Darcy}(D,d)+f_{Poiseuille}(D,d)=1$$

Principles of fluid simulation in cohesive elements modeling a geological formation from which deposits are being extracted, by employing fracking techniques, are described herein. In practice, to implement an embodiment of the invention, a geological formation is modeled using multiple cohesive elements. Then, various flow modeling principles are used, such as by employing the transition equations described hereinabove to simulate the flow of fluid through the various cohesive elements. While the equations and embodiments described hereinabove discuss utilizing Darcy flow and Poiseuille flow, embodiments of the invention are not so limited and may employ any number or combination of NSE and flow simulation techniques.

Figure 9:
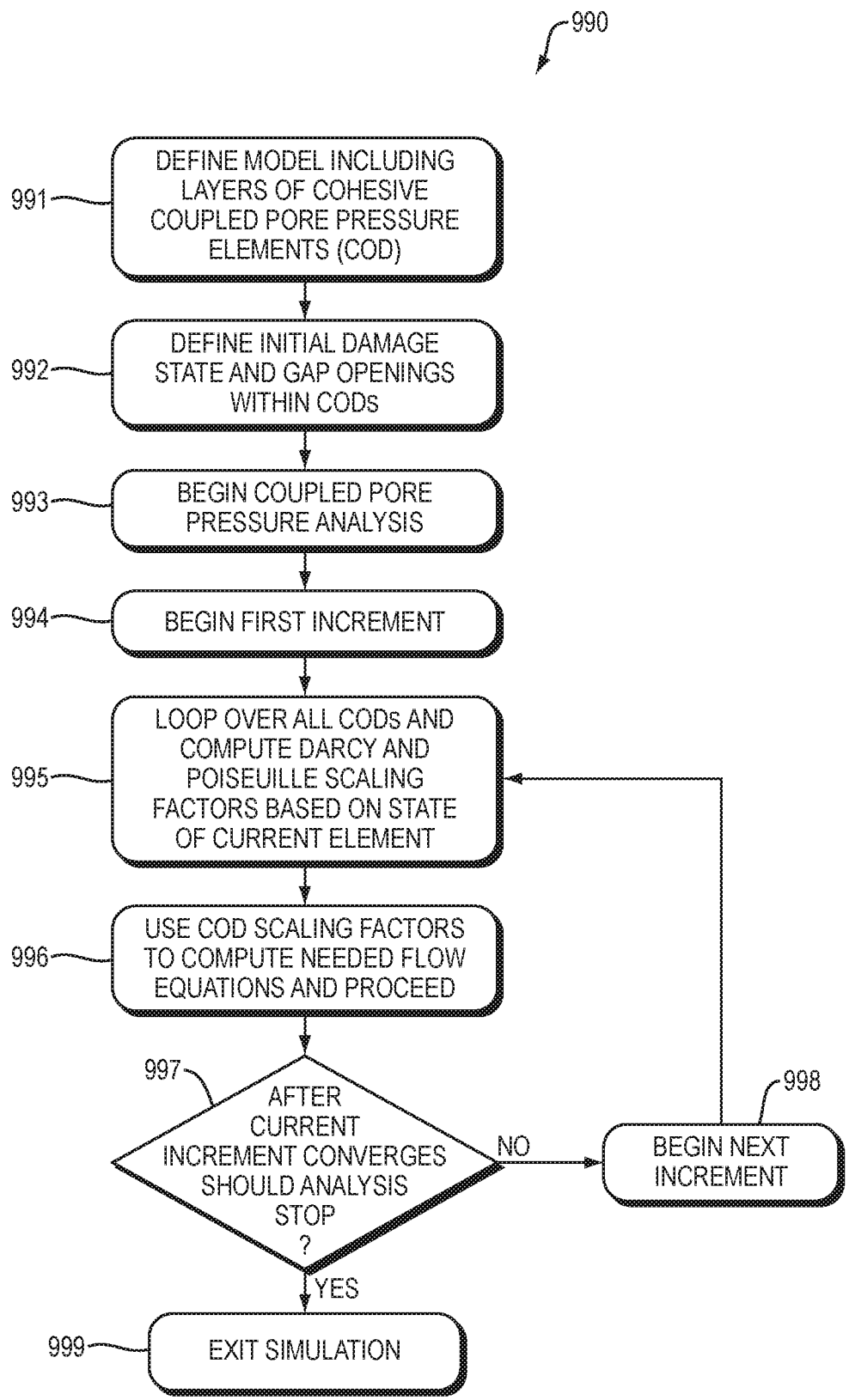
FIG. 9 is a flow diagram of a method of simulating the flow of fluid according to an embodiment.

FIG. 9 is a flow chart of a method 990 of simulating the flow of fluid in a variable environment carried out in accordance with the principles of the present invention. The method 990 begins by defining a model that includes layers of cohesive coupled pore pressure elements (COD) (991). The defining 991 may be done according to principles of modeling a geological or physical environment that are known in the art. Next, initial damage state and gap openings within the CODs are defined (992). Such initial gaps may include a well bore and/or a default gap as described hereinabove. The coupled pore pressure analysis then begins (993) with a first increment (994). The analysis for the first increment 994 loops over all CODs and in such an example, computes Darcy and Poiseuille scaling factors based on the state of the current element (995). These scaling factors indicate respective portions of the flow simulation that are governed by each NSE technique. For example, respective scaling factors may be 0.25 and 0.75, which indicates that 25% of the flow is simulated using Darcy and 75% is simulated using Poiseuille. Such contribution may be time dependent. After determining the scaling factors (995), the flow equations are determined using the scaling factors (996). The flow calculations are then performed using the determined equations until the analysis converges to a solution (997). It is next determined if the analysis should stop at the current increment (997). If the analysis continues, the next increment begins 998 and the method 990 returns to step 995. If it is determined that the analysis can end after the current increment at step 997, the method 990 ends (999).

Figure 10:
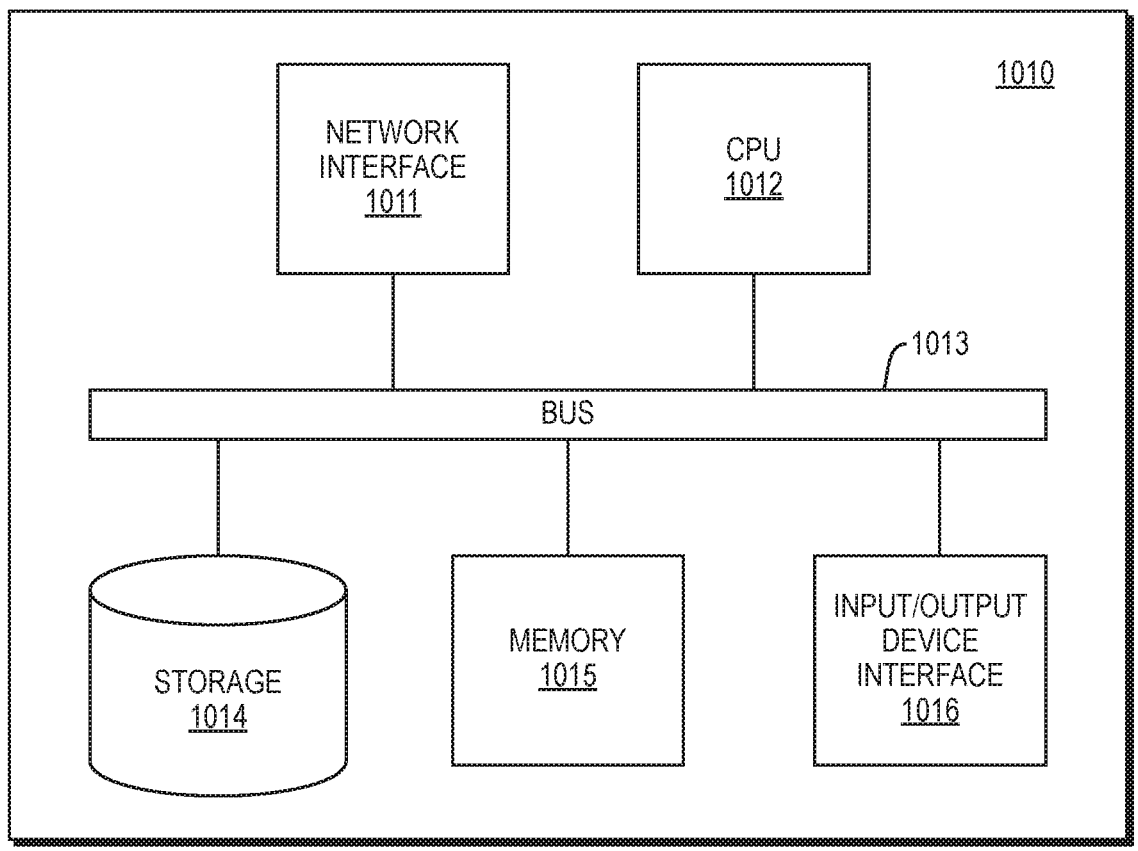
FIG. 10 is a diagram of a computer system that may be configured to implement an embodiment of the invention.

FIG. 10 is a simplified block diagram of a computer-based system 1010 that may be used to perform fluid modeling according to an embodiment of the present invention. The system 1010 comprises a bus 1013. The bus 1013 serves as an interconnect between the various components of the system 1010. Connected to the bus 1013 is an input/output device interface 1016 for connecting various input and output devices such as a keyboard, mouse, display, speakers, etc. to the system 1010. A central processing unit (CPU) 1012 is connected to the bus 1013 and provides for the execution of computer instructions. Memory 1015 provides volatile storage for data used for carrying out computer instructions. Storage 1014 provides non-volatile storage for software instructions, such as an operating system (not shown). The system 1010 also comprises a network interface 1011 for connecting to any variety of networks known in the art, including wide area networks (WANs) and local area networks (LANs).

It should be understood that the example embodiments described herein may be implemented in many different ways. In some instances, the various methods and machines described herein may each be implemented by a physical, virtual, hybrid general purpose computer, such as the computer system 1010, or a computer network environment such as the computer environment 1100, described herein below in relation to FIG. 11. The computer system 1010 may be transformed into the machines that execute the methods described herein, for example, by loading software instructions into either memory 1015 or non-volatile storage 1014 for execution by the CPU 1012. One of ordinary skill in art should further understand that the system 1010 and its various components may be configured to carry out any embodiments of the present invention described herein. Further, the system 1010 may implement the various embodiments described herein utilizing any combination of hardware, software, and firmware modules operatively coupled, internally or externally, to the system 1010.

Figure 11:
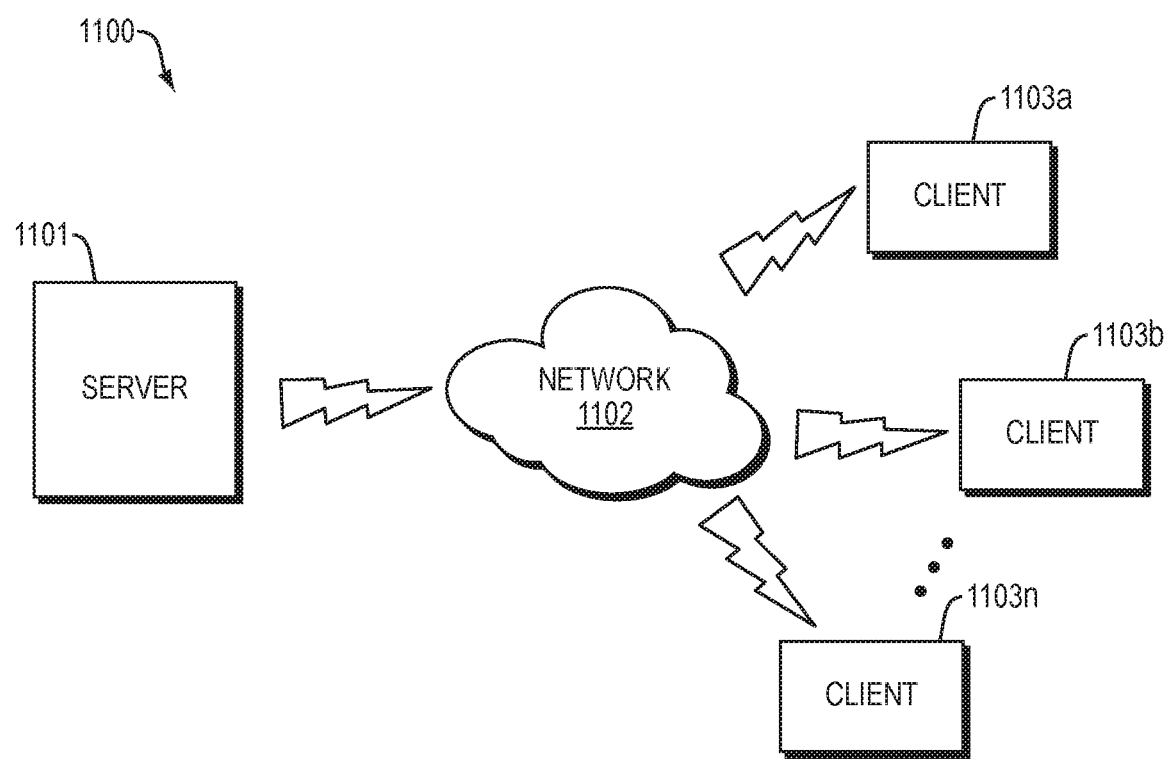
FIG. 11 is a simplified diagram of a computer network environment in which an embodiment of the present invention may be implemented.

FIG. 11 illustrates a computer network environment 1100 in which an embodiment of the present invention may be implemented. In the computer network environment 1100, the server 1101 is linked through the communications network 1102 to the clients 1103*a-n*. The environment 1100 may be used to allow the clients 1103*a-n*, alone or in combination with the server 1101, to execute any of the methods described hereinabove.

Embodiments or aspects thereof may be implemented in the form of hardware, firmware, or software. If implemented in software, the software may be stored on any non-transient computer readable medium that is configured to enable a processor to load the software or subsets of instructions thereof. The processor then executes the instructions and is configured to operate or cause an apparatus to operate in a manner as described herein.

Further, firmware, software, routines, or instructions may be described herein as performing certain actions and/or functions of the data processors. However, it should be appreciated that such descriptions contained herein are merely for convenience and that such actions in fact result from computing devices, processors, controllers, or other devices executing the firmware, software, routines, instructions, etc.

It should be understood that the flow diagrams, block diagrams, and network diagrams may include more or fewer elements, be arranged differently, or be represented differently. But it further should be understood that certain implementations may dictate the block and network diagrams and the number of block and network diagrams illustrating the execution of the embodiments be implemented in a particular way.

Accordingly, further embodiments may also be implemented in a variety of computer architectures, physical, virtual, cloud computers, and/or some combination thereof, and thus, the data processors described herein are intended for purposes of illustration only and not as a limitation of the embodiments.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method of three-dimensional (3D) modeling of a flow of fluid in a variable environment including intermittently opening and closing of fractures, the method comprising:

determining a type of flow as a function of the opening and closing of fractures over time in each of a plurality of layers of a real world variable geological or physical environment;

defining, in computer memory, an improved 3D model of the real world variable geological or physical environment, the model including representations of the plurality of layers of real world cohesive coupled pressure elements;

for each modeled layer, identifying one or more fluid analysis techniques to model the flow of fluid in the respective modeled layer based on the intermittent opening and closing of fractures, the layers having different types of flow using different fluid analysis techniques to model the respective flow of fluid in that layer;

determining a first scaling factor for a first identified fluid analysis technique of the one or more fluid analysis techniques and a second scaling factor for a second identified fluid analysis technique for all cohesive coupled pressure elements, each scaling factor based on a current state of the element, the scaling factors indicate respective portions of the flow simulation that are governed by each analysis technique; and by a processor coupled to the computer memory:

performing a simulation of the flow of fluid in the variable environment using the first scaling factor and the first fluid analysis technique of the one or more fluid analysis techniques identified for each layer of the plurality of layers when a fracture is open;

performing the simulation of the flow of fluid in the variable environment using the second scaling factor and the second fluid analysis technique of the one or more fluid analysis techniques identified for each layer of the plurality of layers when the fracture is closed; and outputting a result of the simulation through an input/output device interface communicatively coupled to the one or more processors.

2. The method of claim 1 wherein the fluid analysis techniques are Navier-Stokes equations.

3. The method claim 1 wherein the fluid analysis techniques are at least one of Darcy flow and Poiseuille flow.

4. The method of claim 1 wherein for a given layer, different fluid analysis techniques are used as a function of time to model a flow of fluid in the layer.

5. The method of claim 4 wherein the one or more fluid analysis techniques to model a flow of fluid in the given layer comprises Darcy flow and Poiseuille flow, the Darcy flow models the flow of fluid in the layer over a first period of time and the Poiseuille flow models the flow of fluid in the layer over a second period of time.

6. The method of claim 1 wherein the simulation of the flow of fluid in the variable environment models at least one of:
hydraulic fracturing; and
injection molding.

7. The method of claim 1 wherein in the fluid comprises water and proppant.

8. A three-dimensional (3D) fluid modeling computer system for modeling the flow of fluid in a variable environment, the system comprising:
one or more processors communicatively coupled to one or more memory devices configured to store instructions and one or more fluid analysis techniques usable by the one or more processors;
a fluid flow model definition module operatively coupled with the one or more processors and configured to define a model of a real world variable geological or physical environment in the one or more memory devices, the model including one or more horizontal layers of cohesive coupled pressure elements;
a fluid flow analysis module operatively coupled to the fluid flow model definition module and configured to, for each horizontal layer of the fluid flow model, identify one or more of the fluid analysis techniques to use to model a flow of fluid in the respective layer, different layers using different fluid analysis techniques to model respective flow of fluid, the fluid flow analysis module further configured to determine a first scaling factor for a first identified fluid analysis technique of the one or more fluid analysis techniques and a second scaling factor for a second identified fluid analysis technique for all cohesive coupled pressure elements, each scaling factor based on a current state of the element, the scaling factors indicate respective portions of the flow simulation that are governed by each analysis technique; and
a fluid flow simulation module configured to perform a simulation of the flow of fluid in the variable environment using the fluid analysis techniques identified for each layer and a respective scaling factor.

9. The system of claim 8 wherein the fluid analysis techniques are Navier-Stokes equations.

10. The system of claim 8 wherein the fluid analysis techniques are at least one of Darcy flow and Poiseuille flow.

11. The system of claim 8 wherein for a given layer, different fluid analysis techniques are used as a function of time to model a flow of fluid in the layer.

12. The system of claim 11 wherein the one or more fluid analysis techniques to model a flow of fluid in the given layer comprises Darcy flow and Poiseuille flow, the Darcy flow models the flow of fluid in the layer over a first period of time and the Poiseuille flow models the flow of fluid in the layer over a second period of time.

13. The system of claim 8 wherein the simulation of the flow of fluid in the variable environment models at least one of:
hydraulic fracturing; and
injection molding.

14. The system of claim 8 wherein in the fluid comprises water and proppant.

15. A computer program product executed by a server in communication across a network with one or more clients, the computer program product comprising:
a non-transitory computer readable medium, the computer readable medium comprising program instructions which, when executed by a processor causes:
defining a fluid flow model of a real world geological or physical environment that includes a first fluid flow in a porous layer represented by a first fluid analysis technique and the first fluid flow inside an open area represented by a second fluid analysis technique, the model including one or more horizontal layers of cohesive coupled pressure elements;
for each layer of the fluid flow model, identifying one or more fluid analysis techniques to use to model a flow of fluid in the respective layer, different layers using different fluid analysis techniques to model respective flow of fluid;
determining a first scaling factor for a first identified fluid analysis technique of the one or more fluid analysis techniques and a second scaling factor for a second identified fluid analysis technique for all cohesive coupled pressure elements, each scaling factor based on a current state of the element, the scaling factors indicate respective portions of the flow simulation that are governed by each analysis technique; and
performing a simulation of the flow of fluid in the variable environment using the fluid analysis techniques identified for each layer and the respective first or second scaling factor.

16. The method of claim 1, further comprising alternating between the second fluid analysis technique and the first fluid analysis technique during the simulation based on a change in the type of flow in the layer.

17. The method of claim 1, wherein the first fluid analysis technique and the second fluid analysis technique comprise different types of Navier-Stokes equations (NSE), said method further comprising improving a performance of the simulation by automatically switching back and forth between different types of NSE during the simulation as compared to a full NSE solution while maintaining engineering accuracy of the simulation within a predetermined accuracy.

* * * * *